US009531209B2

(12) United States Patent
Lamorey et al.

(10) Patent No.: US 9,531,209 B2
(45) Date of Patent: Dec. 27, 2016

(54) SHIELDED PACKAGE ASSEMBLIES WITH INTEGRATED CAPACITOR

(71) Applicant: International Business Machines Corporation, Armonk, NY (US)

(72) Inventors: Mark C. Lamorey, Williston, VT (US); Janak G. Patel, South Burlington, VT (US); Peter Slota, Jr., Vestal, NY (US); David B. Stone, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/822,478

(22) Filed: Aug. 10, 2015

(65) Prior Publication Data

US 2015/0349565 A1    Dec. 3, 2015

Related U.S. Application Data

(62) Division of application No. 14/190,745, filed on Feb. 26, 2014, now Pat. No. 9,209,141.

(51) Int. Cl.
*H01L 21/44*    (2006.01)
*H02J 7/00*    (2006.01)
(Continued)

(52) U.S. Cl.
CPC ............ *H02J 7/0052* (2013.01); *H01L 23/36* (2013.01); *H01L 23/3672* (2013.01);
(Continued)

(58) Field of Classification Search
CPC .............. H01L 23/3675; H01L 23/552; H01L 23/3672; H01L 23/49816; H01L 23/642; H01L 23/50; H01L 23/36; H01L 25/0657; H01L 25/165; H05K 1/144; H05K 1/0215; H05K 1/0204; H05K 1/0216
See application file for complete search history.

(56) References Cited

U.S. PATENT DOCUMENTS

| 7,091,589 B2 | 8/2006 | Mori et al. |
| 7,312,119 B2 | 12/2007 | Balster et al. |

(Continued)

FOREIGN PATENT DOCUMENTS

| DE | 102005041266 A1 | 7/2006 |
| JP | H0745739 A | 2/1995 |

(Continued)

OTHER PUBLICATIONS

Anonymous, "Multi-purpose Integrated Chip Carrier Lid Design" [online] [electronic publication Feb. 12, 2013 retrieved from http://ip.com/IPCOM/000225366, 4 pages.

*Primary Examiner* — Hoa B Trinh
(74) *Attorney, Agent, or Firm* — Scully, Scott, Murphy & Presser, P.C.; Steven J. Meyers

(57) ABSTRACT

Package assemblies including a die stack and related methods of use. The package assembly includes a substrate with a first surface, a second surface, and a third surface bordering a through-hole extending from the first surface to the second surface. The assembly further includes a die stack, a conductive layer, and a lid. The die stack includes a chip positioned inside the through-hole in the substrate. A section of the conductive layer is disposed on the third surface of the substrate. A portion of the lid is disposed between the first chip and the section of the conductive layer. The conductive layer is configured to be coupled with power, and the lid is configured to be coupled with ground. The portion of the lid may act as a first plate of a capacitor, and the section of the conductive layer may act as a second plate of the capacitor.

13 Claims, 4 Drawing Sheets

(51) Int. Cl.

| | | |
|---|---|---|
| *H01L 23/64* | (2006.01) | |
| *H01L 23/552* | (2006.01) | |
| *H01L 23/50* | (2006.01) | |
| *H01L 23/498* | (2006.01) | |
| *H01L 23/36* | (2006.01) | |
| *H01L 23/367* | (2006.01) | |
| *H01L 25/16* | (2006.01) | |
| *H01L 25/065* | (2006.01) | |
| H02J 7/34 | (2006.01) | |
| H01L 23/00 | (2006.01) | |
| H01L 25/18 | (2006.01) | |
| H05K 1/02 | (2006.01) | |
| H05K 1/14 | (2006.01) | |
| H05K 1/16 | (2006.01) | |

(52) U.S. Cl.
CPC .... *H01L 23/3675* (2013.01); *H01L 23/49816* (2013.01); *H01L 23/50* (2013.01); *H01L 23/552* (2013.01); *H01L 23/642* (2013.01); *H01L 25/0657* (2013.01); *H01L 25/165* (2013.01); *H02J 7/0042* (2013.01); *H05K 1/0216* (2013.01); *H01L 24/05* (2013.01); *H01L 24/06* (2013.01); *H01L 24/13* (2013.01); *H01L 24/16* (2013.01); *H01L 24/17* (2013.01); *H01L 24/29* (2013.01); *H01L 24/32* (2013.01); *H01L 24/73* (2013.01); *H01L 24/81* (2013.01); *H01L 25/18* (2013.01); *H01L 2224/0401* (2013.01); *H01L 2224/0557* (2013.01); *H01L 2224/06181* (2013.01); *H01L 2224/131* (2013.01); *H01L 2224/1624* (2013.01); *H01L 2224/16145* (2013.01); *H01L 2224/16146* (2013.01); *H01L 2224/16225* (2013.01); *H01L 2224/16227* (2013.01); *H01L 2224/16235* (2013.01); *H01L 2224/17181* (2013.01); *H01L 2224/29011* (2013.01); *H01L 2224/2919* (2013.01); *H01L 2224/32225* (2013.01); *H01L 2224/32245* (2013.01); *H01L 2224/73253* (2013.01); *H01L 2224/81815* (2013.01); *H01L 2225/06513* (2013.01); *H01L 2225/06517* (2013.01); *H01L 2225/06537* (2013.01); *H01L 2225/06541* (2013.01); *H01L 2225/06589* (2013.01); *H01L 2924/12042* (2013.01); *H01L 2924/141* (2013.01); *H01L 2924/1421* (2013.01); *H01L 2924/1431* (2013.01); *H01L 2924/1434* (2013.01); *H01L 2924/1461* (2013.01); *H01L 2924/15151* (2013.01); *H01L 2924/15311* (2013.01); *H01L 2924/1659* (2013.01); *H01L 2924/16235* (2013.01); *H01L 2924/16251* (2013.01); *H01L 2924/16747* (2013.01); *H02J 7/345* (2013.01); *H05K 1/021* (2013.01); *H05K 1/0204* (2013.01); *H05K 1/0215* (2013.01); *H05K 1/144* (2013.01); *H05K 1/162* (2013.01); *H05K 2201/0116* (2013.01); *H05K 2201/0187* (2013.01); *H05K 2201/041* (2013.01); *H05K 2201/0999* (2013.01); *H05K 2201/1056* (2013.01); *H05K 2201/10515* (2013.01)

(56) References Cited

U.S. PATENT DOCUMENTS

| | | | |
|---|---|---|---|
| 7,701,052 | B2 | 4/2010 | Borland et al. |
| 7,940,876 | B2 | 5/2011 | Wang et al. |
| 8,039,952 | B2 | 10/2011 | Mullen et al. |
| 8,283,755 | B2 | 10/2012 | Hayasaka et al. |
| 8,390,109 | B2 | 3/2013 | Popovic et al. |
| 8,471,362 | B2 | 6/2013 | Lee |
| 2010/0181285 | A1* | 7/2010 | Tanaka ............ H01G 4/232 216/17 |
| 2011/0018119 | A1 | 1/2011 | Kim et al. |
| 2011/0175639 | A1 | 7/2011 | Yoko et al. |
| 2013/0175702 | A1 | 7/2013 | Choi et al. |

FOREIGN PATENT DOCUMENTS

| | | |
|---|---|---|
| JP | 2001118980 A | 4/2001 |
| JP | 2010114469 A | 5/2010 |

* cited by examiner

SHIELDED PACKAGE ASSEMBLIES WITH INTEGRATED CAPACITOR

BACKGROUND

The invention generally relates to semiconductor manufacturing and, more particularly, to package assemblies including a die stack and related methods of use.

Die stacks arrange the constituent chips or dies in a compact three-dimensional stack characterized by multiple tiers. The functionality of a die stack requires functionality of each individual die. The stacked arrangement of the three-dimensional integration conserves space and shortens signal transmission distances for inter-die communications, which may improve both efficiency and performance of the die stack. During manufacture, each die is processed independently to form integrated circuits. The different dies are subsequently stacked in a three-dimensional arrangement and bonded together so that the dies are vertically arranged with permanent attachment to each other and connectivity with each other. For end use, the chip stack may be assembled with a carrier substrate and mounted to another type of substrate, such as a printed circuit board.

Improved package assemblies including a die stack and related methods of use are needed.

SUMMARY

In an embodiment of the invention, an assembly includes a substrate with a first surface, a second surface, and a third surface bordering a through-hole extending from the first surface to the second surface. The assembly further includes a die stack, a conductive layer, and a lid. The die stack includes a chip positioned inside the through-hole in the substrate. A section of the conductive layer is disposed on the third surface of the substrate. A portion of the lid is disposed between the first chip and the section of the conductive layer. The conductive layer is configured to be coupled with power, and the lid is configured to be coupled with ground.

In another embodiment of the invention, a method is provided for electrostatically storing energy in an assembly including a chip stack. The method includes storing a first charge on a first plate of a capacitor provided by a lid coupled with the chip stack. The method further includes storing a second charge on a second plate of the capacitor provided by a section of a conductive layer on a substrate supporting the chip stack.

BRIEF DESCRIPTION OF THE SEVERAL VIEWS OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
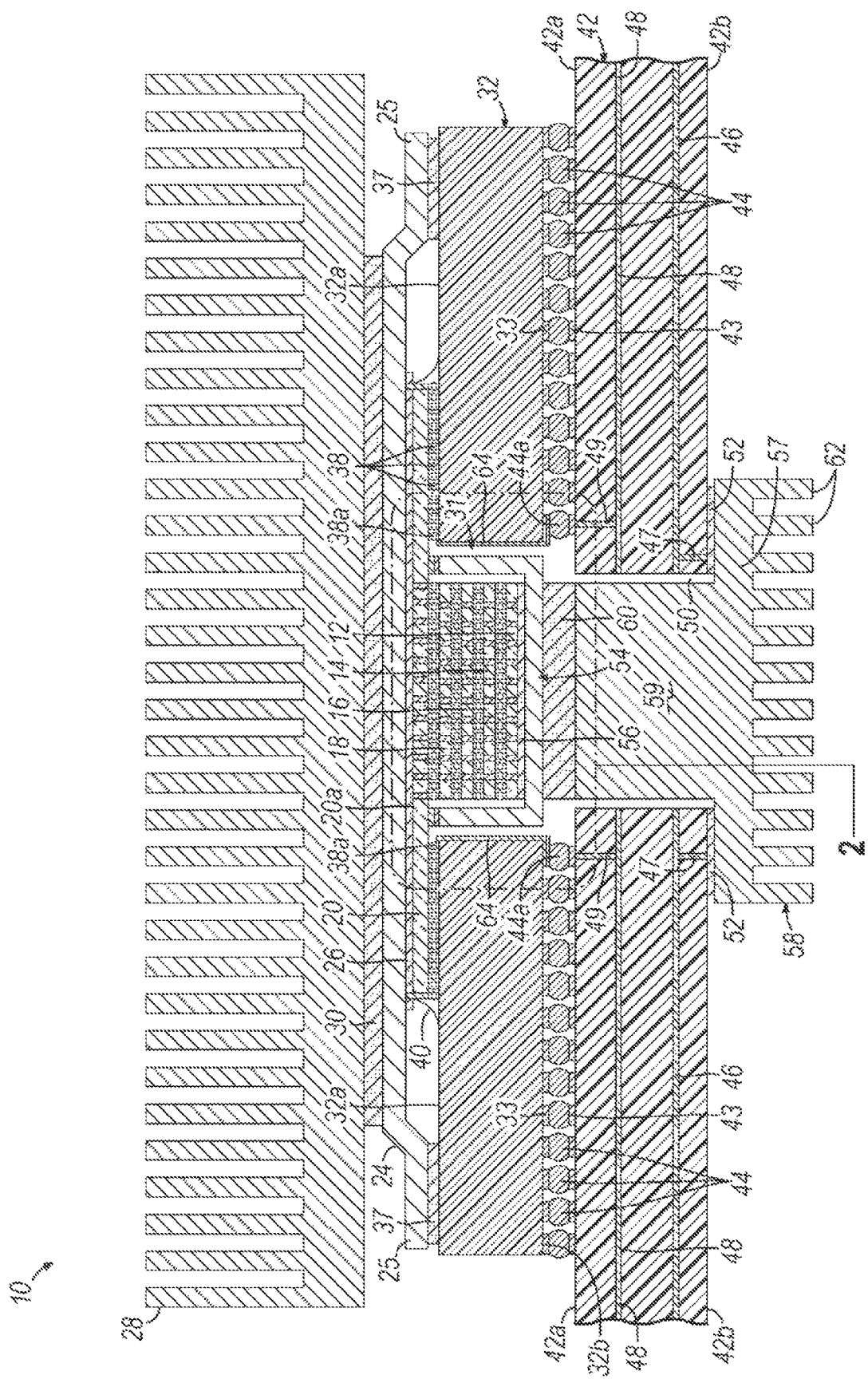
FIG. 1 is a cross-sectional view of a package for a die stack in accordance with an embodiment of the invention.
Figure 2:
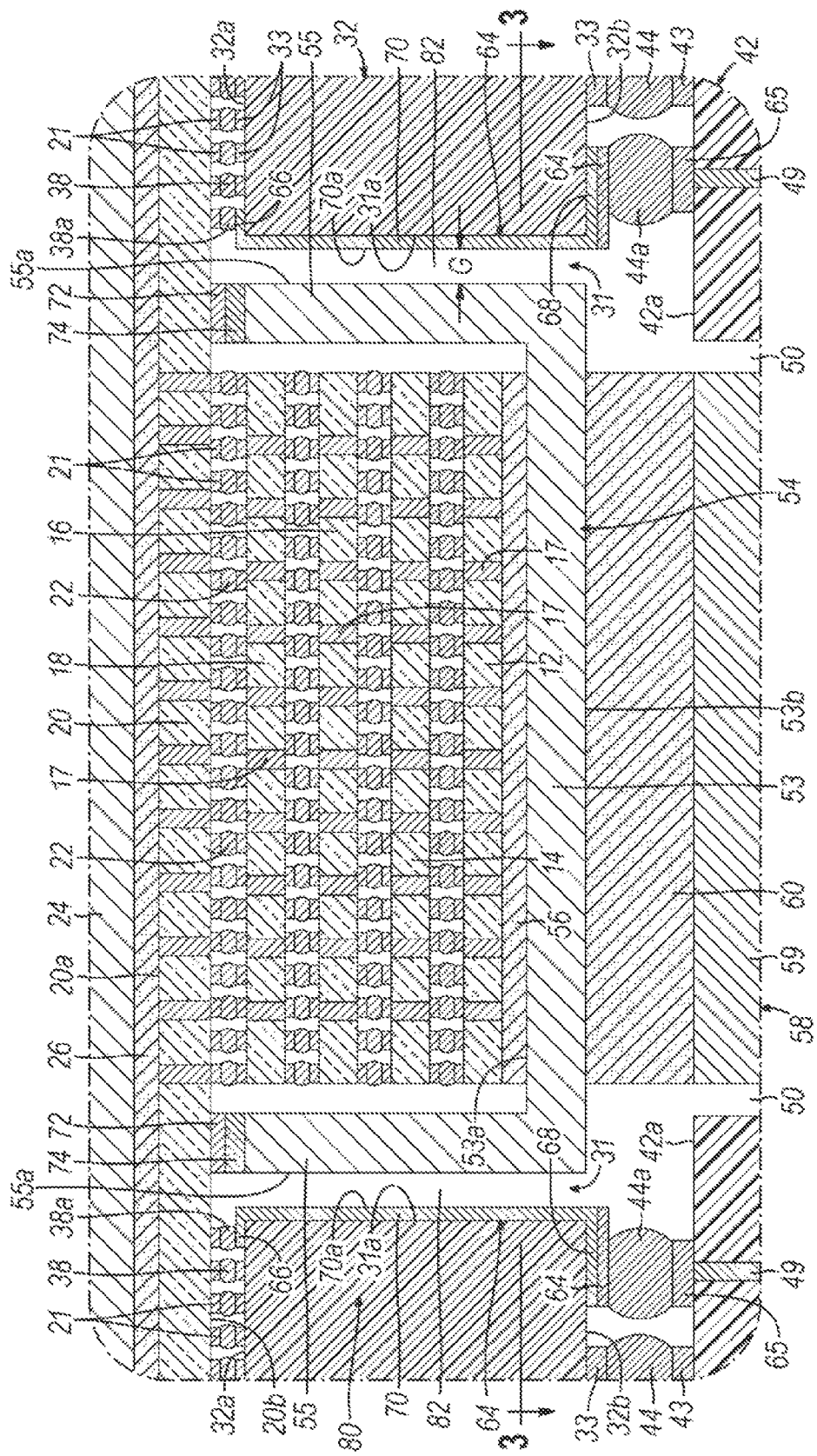
FIG. 2 is an enlarged cross-sectional view of a portion of the package of FIG. 1.
Figure 3:
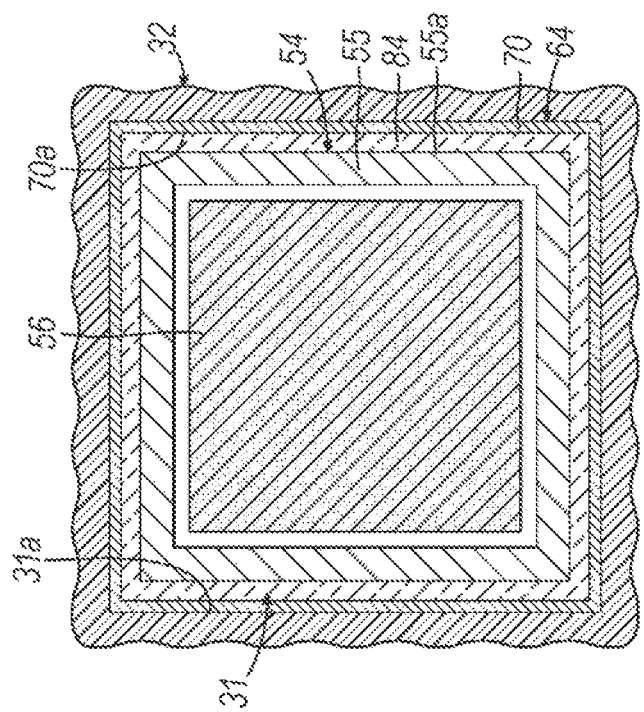
FIG. 3 is cross-sectional view taken generally along line 3-3 in FIG. 2.

With reference to FIGS. 1-3 and in accordance with an embodiment of the invention, a package assembly 10 includes plurality of chips or dies 12, 14, 16, 18, 20 arranged in a vertical stack to define a die stack. Adjacent pairs of the dies 12, 14, 16, 18, 20 are joined in a face-to-face fashion by solder balls 22 that are reflowed to define solder joints coupled with respective bond pads 21 and to provide physical and electrical connections. In the representative embodiment, the dimensions of die 20 are greater than the dimensions of dies 12, 14, 16, 18, which may be of comparable size. Die 12 is vertically located at an opposite end of the die stack from the end at which die 20 is located.

Each of the dies 12, 14, 16, 18, 20 in the die stack comprises one or more integrated circuits fabricated with a front-end-of-line process, such as a complementary metal-oxide-semiconductor (CMOS) process, using a portion of a semiconductor wafer. The dies 12, 14, 16, 18, 20 may be fabricated with different technology nodes (130 nm, 90 nm, 65 nm, 45 nm, etc.), or may be characterized by a specific circuitry type (RF, analog, photonic, memory, MEMS, digital, etc.). In one embodiment, the die 20 may be a custom logic or processor chip and each of the dies 12, 14, 16, 18 may be a memory chip, such as a dynamic access memory chip, that are stacked with die 20. The stacked arrangement may improve performance, bandwidth, and/or functionality.

Each of the dies 12, 14, 16, 18, 20 may also comprise an interconnect structure fabricated with middle-end-of-line and back-end-of-line processes. Each interconnect structure is configured to communicate signals to and from the integrated circuits on each of the dies 12, 14, 16, 18, 20 and to provide power and ground connections for the integrated circuits. Extending through the thickness of each of the dies 12, 14, 16, 18, 20 are conductive features 17. The conductive features 17, in conjunction with the interconnect structures, couple bond pads 21 on opposite top and bottom sides of the dies 12, 14, 16, 18, 20 to define continuous conductive paths. The conductive features 17 may comprise through silicon vias (TSVs). The TSVs comprising the conductive features 17 may be fabricated by deep reactive ion etching or laser drilling a deep via into the substrate, electrically insulating the deep via, lining the via with a conductive liner that is a diffusion barrier and/or adhesion promoter, and filling the via with a metal (e.g., copper, tungsten). The substrate may be thinned from the back side by a wet or dry etch to reduce its original thickness and thereby expose the metal of each TSV. The thicknesses of the different dies 12, 14, 16, 18, 20 may vary, and the conductive features 17 may only extend through the semiconductor wafer portion and yet be considered to extend through the respective die.

The package assembly 10 further includes a lid 24, a heat sink 28, a substrate in the representative form of a laminate substrate 32, and a substrate in the representative form of a printed circuit board 42 that are assembled with the die stack. The lid 24 is coupled with a confronting surface 20a of the die 20 by a first-level thermal interface material layer 26. The lid 24 is comprised of an electrically conductive and thermally conductive material, such as copper coated with nickel. The heat sink 28 is coupled with a confronting surface of the lid 24 by a second-level thermal interface material layer 30. The thermal interface material layers 26, 30 may be effective to reduce the contact resistance between the mating heat-generating and heat-sinking units by filling micro-gaps located between the mating surfaces. The thermal interface material layers 26, 30 may also function as heat spreaders.

The thermal interface material layers 26, 30 may be comprised of a thermal adhesive, a thermal grease, a thermal gel, a phase change material, a thermal pad, or a combination thereof. The material(s) comprising the thermal interface material layers 26, 30 are thermally conductive and may also be electrically conductive. The thermal resistance of the thermal interface material layers 26, 30 may depend upon, among other factors, contact resistance, bulk thermal conductivity, and layer thickness.

A flange 25 of the lid 24 is mechanically coupled at its edges by a conductive adhesive layer 37 with a surface 32a of the laminate substrate 32. The attachment of the flange 25 with the laminate substrate 32 adds mechanical strength to the package assembly 10. The lid 24 operates as a heat spreader that conducts heat generated by the dies 12, 14, 16, 18, 20 to the heat sink 28.

The dies 12, 14, 16, 18 are positioned inside of a through-hole 31 extending through the laminate substrate 32 from surface 32a of laminate substrate 32 to surface 32b of laminate substrate 32. Die 12 is located proximate to one open end of the through-hole 31 and die 18 is located proximate to an opposite open end of the through-hole 31. The die 20, which is larger in cross-sectional area than the through-hole 31, is positioned outside of the through-hole 31 and adjacent to surface 32a of the laminate substrate 32. Reflowed solder balls 38 defined solder joints coupling bond pads 21 on the surface 20b of the die 20 with corresponding bond pads 33 on the surface 32a of the laminate substrate 32. Solder balls 22 on die 18 attach dies 12, 14, 16, 18 as an assembly to the surface 20b of die 20, which is the same surface 20b of die 20 that is proximate to the through-hole 31 in the laminate substrate 32 and that carries solder balls 22.

An underfill 40 may be applied that fills the open space in the gap between the die 20 and the laminate substrate 32 that is not occupied by the solder balls 38, and may include a filet at the outer edges of the die 20. The underfill 40 protects the reflowed solder balls 38 against various adverse environmental factors, redistributes mechanical stresses due to shock, and prevents the solder balls 38 from moving under strain during thermal cycles when the chip stack of the package assembly 10 is operating in an end use device.

The printed circuit board 42 is positioned adjacent to the surface 32b of the laminate substrate 32. The printed circuit board 42 includes bond pads 43 at surface 42a that are coupled with bond pads 33 at a surface 32b of the laminate substrate 32 by solder joints defined by reflowed solder balls 44. The printed circuit board 42 also includes a ground plane 46 and ground vias 47 coupled with the ground plane 46. The ground vias 47 are accessible at a surface 42b of the printed circuit board 42 so that external connections can be established with the ground plane 46. The printed circuit board 42 also includes a power plane 48 and power vias 49 coupled with the power plane 48. The power vias 49 are accessible at a surface 42a of the printed circuit board 42 via bond pads 65 so that external connections can be established with the power plane 48.

A through-hole 50 extends through printed circuit board 42 and communicates with one end of the through-hole 31 extending through the laminate substrate 32. The through-holes 31, 50, which are each open-ended, may be centrally located in the laminate substrate 32 and the printed circuit board 42, respectively, and may be aligned along a common centerline.

A lid 54 is positioned inside the through-hole 31 extending through the laminate substrate 32. Similar to lid 24, the lid 54 is comprised of an electrically conductive and thermally conductive material, such as copper coated with nickel. The lid 54, which may be cup shaped, includes a cap or base 53 and a portion in the representative form of a flange 55. The flange 55 that projects from the base 53 into a space inside the through-hole 31 that is between the laminate substrate 32 and the die stack. The base 53 of the lid 54 has a surface 53a that is coupled with a confronting surface of the die 12 by a thermal interface material layer 56. Some of the conductive features 17 on die 12 may be coupled by the thermal interface material layer 56, which is electrically conductive, with the lid 54. The flange 55 of the lid 54 is attached to a ground structure in the representative form of one or more ground pads 72 on die 20 with a conductive connection 74 that has a high electrical conductivity. Depending on the design, the ground structure may be a ground ring. The conductive connection 74 may be comprised of, for example, a bead of an electrically-conductive epoxy.

A heat sink 58 is comprised of portions including a flange 57, a pedestal 59, and a plurality of fins 62 that project from the flange 57. The pedestal 59 is sized to fit inside of the through-hole 50. The pedestal 59 of the heat sink 58 is coupled by a thermal interface material layer 60 with a surface 53b of the base 53 of the lid 54. The flange 57 is sized to be coupled with a confronting surface 42b of the printed circuit board 42 by a thermal interface material layer 52. The thermal interface material layer 52 establishes an electrical connection between the heat sink 58 and the ground vias 47 in the printed circuit board 42 such that the ground plane 46 of the printed circuit board 42 is coupled with the heat sink 58.

The thermal interface material layers 52, 56, 60 may be similar in function and composition to the thermal interface material layers 26, 30. However, the thermal interface materials comprising the thermal interface material layers 52, 56, 60 should have a high electrical conductivity and a low thermal resistance (i.e., high thermal conductivity). In one embodiment, the thermal conductivity through the thickness of the thermal interface material layers 52, 56, 60 may be on the order of 1 W/mK to 10 W/mK and the electrical conductivity may be on the order of $10^{-5}$ ohm-cm to $10^{-6}$ ohm-cm.

In the package assembly 10, the lid 54 and the heat sink 58 are at a ground potential. In particular, the heat sink 58 is coupled with the ground plane 46 of the printed circuit board 42 and the lid 54 is coupled with the heat sink 58.

The through-hole 31 in the laminate substrate 32 of package assembly 10 includes a conductive layer 64 that provides an electrically continuous path from surface 32a of the laminate substrate 32 to the opposite surface 32b of the laminate substrate 32. The conductive layer 64 may be a continuous coating of a conductor that covers the sidewall 31a of the through-hole 31. In one embodiment, the conductive layer 64 may be comprised of copper deposited by an electrochemical plating process, such as electroplating.

The conductive layer 64 may include a section 66, a section 68, and a section 70 that connects section 66 with section 68. The sections 66, 68 of conductive layer 64 may each be ring-shaped and encircle the respective end openings to the through-hole 31. The section 66 of conductive layer 64 is positioned on the surface 32a of the laminate substrate 32 and is coupled by specific solder balls 38a from among solder balls 38 with the die 20. The section 68 of conductive layer 64 is positioned on the surface 32b. The section 68 of conductive layer 64 is coupled by specific solder balls 44*a* from among solder balls 44 with bond pads 65 that are coupled with the power via 49 and, thereby, coupled with the power plane 48 of the printed circuit board 42. Power can be supplied directly from the power plane 48 in the printed circuit board 42 through the conductive layer 64 to die 20.

The section 70 of conductive layer 64 and the flange 55 of lid 54 may define conductors or plates of a capacitor, generally indicated by reference numeral 80. In the representative embodiment, the section 70 conductive layer 64 is coupled with the power plane 48 of the printed circuit board 42, and the flange 55 of lid 54 is coupled with the ground plane 46 of the printed circuit board 42. A gap 82 is defined as a space between a surface 55*a* of flange 55 and a surface 70*a* of the section 70 of the conductive layer 64, and represents a portion of the space inside the through-hole 31 in the laminate substrate 32. Each of the surfaces 55*a*, 70*a* has an area characterized by a length and width.

Among other factors, the capacitance of the capacitor 80 is a function of the area of each of the surfaces 55*a*, 70*a*, the gap 82 defining the separation between the surfaces 55*a*, 70*a*, and the permittivity of the gap 82. The gap 82 separating the plates of the capacitor 80 comprises a non-conductive region comprised of a dielectric having a permittivity. The gap 82 may comprise an airgap filled by a gas, which may be characterized by a permittivity of near unity (about 1.0). The gas filling the gap G may be air at or near atmospheric pressure, or another type of gas (e.g., nitrogen) at or near atmospheric pressure. The gap 82 has a width, G, that is measured as a distance between surfaces 55*a*, 70*a* and may be adjusted through selection of design parameters for the lid 54 and conductive layer 64.

When the ground plane 46 and the power plane 48 are powered (e.g., when the package assembly 10 is deployed in an electronic device and in an operational state) and a potential difference exists between the plates of the capacitor 80, the plates hold equal and opposite charges on their facing surfaces 55*a*, 70*a* and an electric field is present in the gap 82. The surfaces 55*a*, 70*a* may be disposed in parallel planes such that the capacitor 80 represents a parallel plate capacitor. The capacitor 80 provides a discrete passive electrical component within the package assembly 10 that can be used to electrostatically store energy.

The lid 54 contributes a Faraday shield that is located proximate to a source of electromagnetic interference (EMI) radiation, namely the dies 12, 14, 16, 18. The EMI radiation is captured by the lid 54 before the EMI radiation can escape from the package assembly 10 to interrupt, obstruct, or otherwise degrade or limit the effective performance of other components on the printed circuit board 42 or to otherwise escape to an exterior of a system box housing the printed circuit board 42. In particular, the base 53 and flange 55 of the lid 54 are grounded so that the EMI radiation can be dissipated as an electrical current to ground provided by the ground plane 46 in the printed circuit board 42. The EMI radiation can be captured by the Faraday shield supplied by lid 54 without any specific alteration to the die stack, the laminate substrate 32, or the printed circuit board 42.

The dies 12, 14, 16, 18, 20 represent heat sources that generate heat energy when energized and operating an end use device, and that are also thermally coupled together as a heat-generating system. Heat is transferred in multiple directions from the dies 12, 14, 16, 18, 20, as opposed to a single direction, for dissipation. The lid 24 and heat sink 28 provide one primary path in one direction to dissipate heat generated by the dies 12, 14, 16, 18, 20. The lid 54 and heat sink 58 provide an independent and distinct primary path in an opposite direction to dissipate heat generated by the dies 12, 14, 16, 18, 20. Specifically, the lid 54 cooperates with the thermal interface material layers 56, 60 to conduct heat generated by the dies 12, 14, 16, 18, 20 in a conduction path from die 12 to the heat sink 58.

Figure 5:
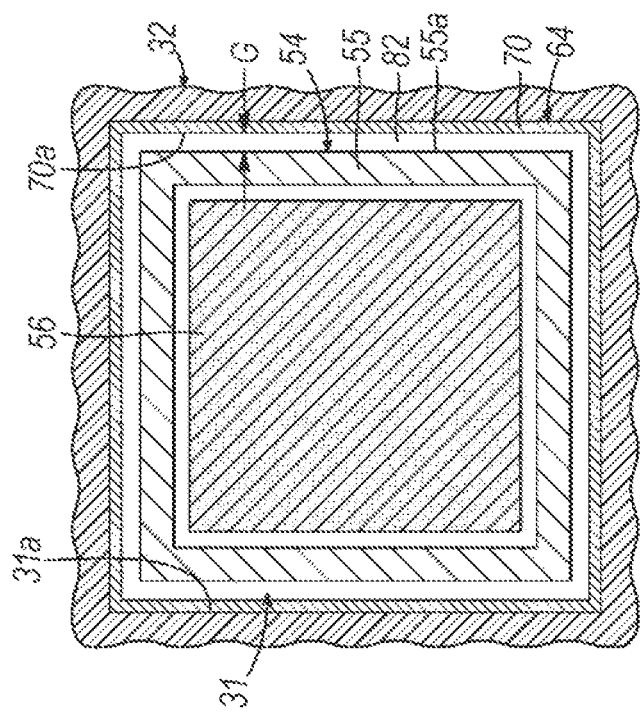
FIG. 5 is cross-sectional view taken generally along line 5-5 in FIG. 4.
Figure 4:
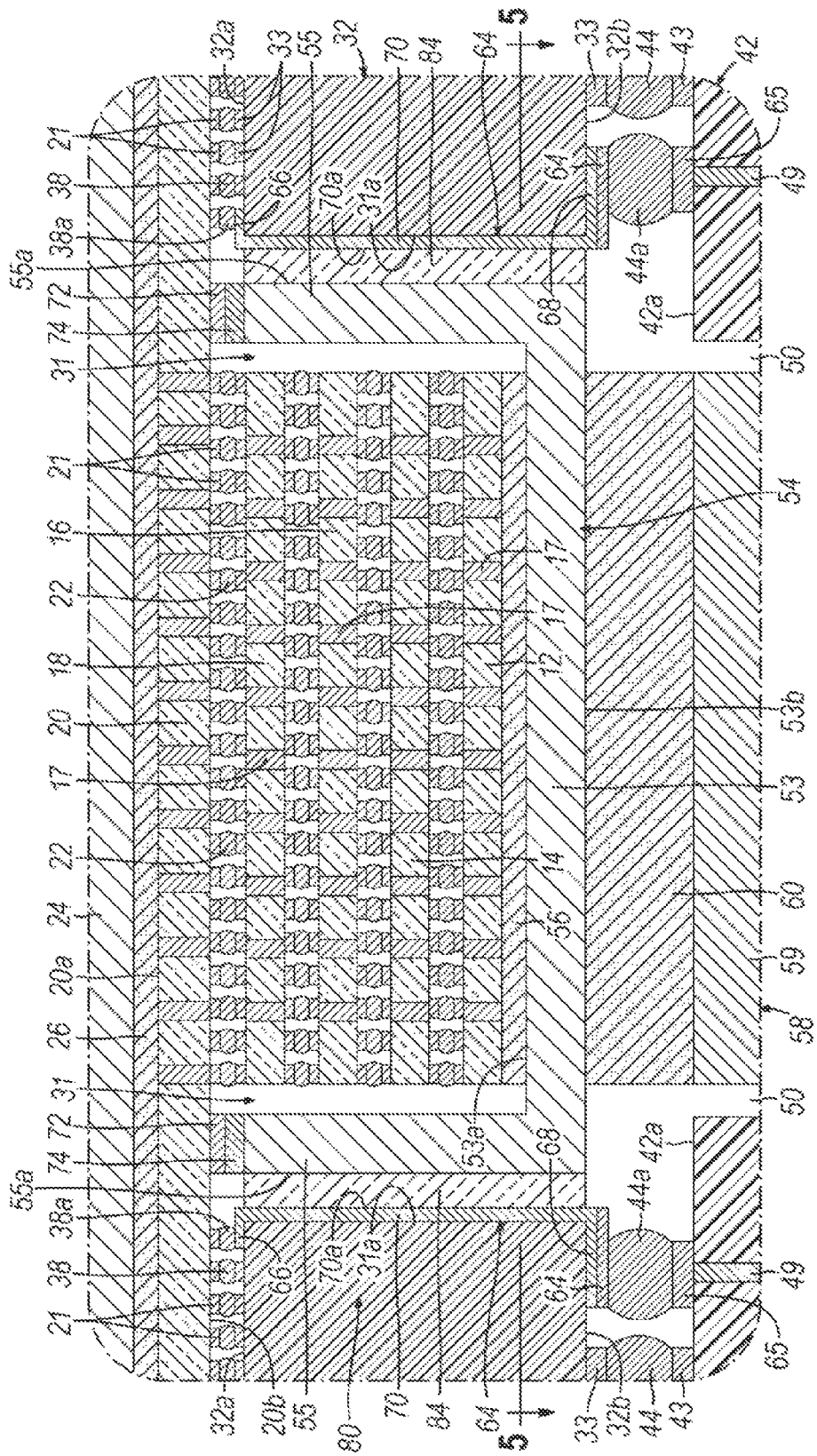
FIG. 4 is a cross-sectional view similar to FIG. 2 in accordance with an alternative embodiment of the invention.

With reference to FIGS. 4, 5 and in accordance with an alternative embodiment, the gap 82 may be filled with a dielectric layer 84 that is a solid or porous dielectric material characterized by a permittivity that is greater than the permittivity of air. Alternatively, the gap may be partially filled with the dielectric layer 84 and may partially comprise an airgap. The dielectric layer 84 may be deployed as a thin sheet of the dielectric material that is inserted into the gap 82 or as a coating of the dielectric material (e.g., an oxide) that is applied, attached, bonded, etc. to one or both of the surfaces 55*a*, 70*a*.

The dielectric material comprising the dielectric layer 84 may be selected to tailor the capacitance of the capacitor 80. The dielectric material of dielectric layer 84 may be comprised of an electrical insulator, such as glass, a ceramic, a polymer, paper, or mica, characterized by a permittivity that is greater than the permittivity of air. The capacitance of the capacitor 80 will increase with increasing permittivity of the material occupying the gap between the plates.

To assemble the package assembly 10, the dies 12, 14, 16, 18 of similar dimensions may be stacked together to define a preliminary die stack and then the die stack including the dies 12, 14, 16, 18 may be stacked on to the larger die 20 to define a finished die stack. The dies 12, 14, 16, 18 are located on the same side of die 20 as the solder balls 38 used to attach die 20 to the laminate substrate 32. The die stack consisting of dies 12, 14, 16, 18, 20 is then inserted in the through-hole 31 of laminate substrate 32 and attached to the laminate substrate 32 with die 20 specifically soldered by reflowed solder balls 38 on to the top side of the laminate substrate 32. The lid 54 is clamped and/or attached to the die 12 of the die stack from the one side of the through-hole 31 with the thermal interface material layer 60 disposed between the die 12 and the lid 54. The optional dielectric layer 84 may be applied to the lid 54 before assembly and/or inserted into the gap during assembly. The flange 55 of the lid 54 is attached to ground pads 72 on die 20 with the conductive connection 74. The thermal interface material layer 60 between the die 12 and the lid 54 is electrically conductive.

The solder balls 44 are then attached to the surface 32*b* of the laminate substrate 32. The assembly is soldered onto the printed circuit board 42 by reflowing the solder balls 44. The heat sink 28 is then attached to lid 24 using thermal interface material layer 30. Sections 66, 68 of conductive layer 64 may define plated power rings at the periphery of the through-hole 31 on both surfaces 32*a*, 32*b* of the laminate substrate 32, and are electrically connected to the power plane 48. The conductive features 17 (e.g., TSVs) of die 12 extend to the exposed surface adjacent to the lid 54 to establish a grounded electrical connection with the lid 54 via the thermal interface material layer 60. The thermal interface material layer 52 establishes an electrical connection between the heat sink 58 and the ground vias 47 in the printed circuit board 42. After the assembly is soldered onto the printed circuit board 42 by reflowing the solder balls 44, the heat sink 54 is attached through the through-hole 50 in the printed circuit board 42 to the lid 54.

It will be understood that when an element is described as being "connected" or "coupled" to or with another element, it can be directly connected or coupled to the other element or, instead, one or more intervening elements may be present. In contrast, when an element is described as being "directly connected" or "directly coupled" to or with another element, there are no intervening elements present. When an element is described as being "indirectly connected" or "indirectly coupled" to or with another element, there is at least one intervening element present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for electrostatically storing energy in a package assembly including a chip stack and a lid, the method comprising: storing a first charge on a first plate of a capacitor provided by the lid coupled with the chip stack; and storing a second charge on a second plate of the capacitor provided by a section of a conductive layer on a first substrate of the package assembly that supports the chip stack, wherein the first substrate includes a first throughhole, the section of the conductive layer is provided on a surface of the first through-hole, and the lid includes a flange that is located inside the first through-hole and that is separated from the section of the conductive layer by a gap.

2. The method of claim 1 further comprising: shielding electromagnetic interference radiation emitted from the chip stack with the lid.

3. The method of claim 1 further comprising: dissipating heat generated by the chip stack through the lid to a heat sink.

4. The method of claim 1 wherein storing the first charge on the first plate of the capacitor provided by the lid coupled with the chip stack further comprises: grounding the lid to a ground plane in a second substrate.

5. The method of claim 1 wherein storing the second charge on the second plate of the capacitor provided by the section of the conductive layer on the first substrate supporting the chip stack comprises: powering the section of the conductive layer from a power plane in a second substrate that supports the first substrate.

6. The method of claim 1 wherein the gap is an airgap.

7. The method of claim 6 wherein the airgap is filled by a gas.

8. The method of claim 7 wherein the gas has a permittivity of about 1.0.

9. The method of claim 7 wherein the gas is air or nitrogen.

10. The method of claim 1 wherein the conductive layer is ring-shaped.

11. The method of claim 1 further comprising a solder ball on the conductive layer of the first substrate.

12. The method of claim 1 wherein the gap is filled with a dielectric layer having a permittivity that is greater than air.

13. The method of claim 1 wherein the gap is filled with a dielectric layer and an airgap.

* * * * *